(12) United States Patent
Harris

(10) Patent No.: US 11,763,046 B2
(45) Date of Patent: Sep. 19, 2023

(54) TECHNIQUES FOR AUTOMATICALLY SELECTING SIMULATION TOOLS FOR AND PERFORMING RELATED SIMULATIONS ON COMPUTER-GENERATED DESIGNS

(71) Applicant: AUTODESK, INC., San Francisco, CA (US)

(72) Inventor: Andrew John Harris, London (GB)

(73) Assignee: AUTODESK, INC., San Francisco, CA (US)

( * ) Notice: Subject to any disclaimer, the term of this patent is extended or adjusted under 35 U.S.C. 154(b) by 198 days.

(21) Appl. No.: 16/675,139

(22) Filed: Nov. 5, 2019

(65) Prior Publication Data

US 2021/0133294 A1 May 6, 2021

(51) Int. Cl.
*G06F 30/17* (2020.01)
*G06F 30/15* (2020.01)
*G06F 30/23* (2020.01)

(52) U.S. Cl.
CPC .............. *G06F 30/17* (2020.01); *G06F 30/15* (2020.01); *G06F 30/23* (2020.01)

(58) Field of Classification Search
CPC .......... G06F 30/17; G06F 30/23; G06F 30/15; E21B 2200/20
USPC ........................................................ 703/7, 6
See application file for complete search history.

(56) References Cited

U.S. PATENT DOCUMENTS

| 8,285,522 | B1* | 10/2012 | Tryon, III ............... | G06F 30/23 703/2 |
| 10,783,296 | B1* | 9/2020 | Ershov .................. | G06F 30/327 |
| 2009/0031268 | A1* | 1/2009 | Miranda ............ | G06F 30/3312 716/113 |
| 2014/0365180 | A1* | 12/2014 | Lam ........................ | G06F 30/13 703/1 |
| 2015/0310154 | A1* | 10/2015 | Bobok .................... | G06F 30/33 716/106 |

\* cited by examiner

*Primary Examiner* — Cedric Johnson
(74) *Attorney, Agent, or Firm* — Artegis Law Group, LLP

(57) ABSTRACT

A simulation suggestion system comprising a server connected with a plurality of clients via a network. The server executes a design engine for generating designs, a simulation suggestion engine for identifying suggested simulations for the designs, and a simulation engine for performing the suggested simulations on the designs. The simulation engine includes one or more simulation tools for performing one or more suggested simulations on a design. A user completes a design of an object via the design engine. The simulation suggestion engine automatically identifies one or more simulation tools that are appropriate for the completed design based on at least one characteristic of the design. The simulation suggestion engine automatically identifies and loads simulation parameters (boundary conditions) for the suggested simulation tools. The suggested simulation tools are then performed on the completed design via the simulation engine.

18 Claims, 13 Drawing Sheets

TECHNIQUES FOR AUTOMATICALLY SELECTING SIMULATION TOOLS FOR AND PERFORMING RELATED SIMULATIONS ON COMPUTER-GENERATED DESIGNS

BACKGROUND OF THE INVENTION

Field of the Various Embodiments

The present invention relates generally to computer science and, more specifically, to techniques for automatically selecting simulation tools for and performing related simulations on computer-generated designs.

DESCRIPTION OF THE RELATED ART

Software applications, such as computer-aided design (CAD) applications, are commonly used by architects, engineers, and other design professionals (hereinafter "designers") to aid in the creation, modification, analysis, and/or optimization of a design. Among other things, using software applications can substantially increase the productivity of the designer and/or improve the overall quality of a design. A CAD application is used to construct computer models representing real-world constructs/objects, such as buildings, vehicles, vehicle components, electronic devices and appliances, furniture, and the like. The output of a software application also may include electronic files comprising a three-dimensional (3D) printable design that can be exported to a 3D fabrication device that fabricates a physical product.

Using such a design application, a designer completes a design of a particular object, the particular object being intended for a particular purpose/function. After completing a design, an experienced user typically identifies and implements various simulation tools to perform simulations on the completed design via a simulation application. Simulations are performed to ensure that the completed design is sufficient for the intended purpose/function of the completed design. However, novice users typically do not know that simulations should be performed on a completed design, do not have the knowledge to identify which simulations are appropriate for particular designs, or do not have the experience to properly setup and execute a simulation on a design. Consequently, novice users typically do not perform any simulations on completed designs, perform unsuitable simulations on designs, or improperly setup a simulation on a completed design. By not performing the appropriate simulations on a completed design, a user does not know whether the completed design is satisfactory for the intended purpose/function of the completed design. Proceeding with an untested design incurs significant costs and risks in later production of the object being designed.

Currently, there are no technical solutions for assisting users in identifying appropriate simulations for completed designs and/or assisting users to properly setup and perform a simulation for a completed design. As noted above, users must rely on their own knowledge and experience in identifying and setting up simulations for completed designs. Thus, the lack of technical solutions is particularly problematic for more novice users.

As the foregoing illustrates, what is needed in the art are more effective techniques for identifying, setting up, and performing simulations for computer-generated designs.

SUMMARY OF THE INVENTION

Various embodiments include a computer-implemented method for automatically selecting and executing one or more simulation tools for designs. The computer-implemented method includes executing, via a simulation suggestion engine, at least one analysis tool to determine at least one characteristic of a computer-generated design. The computer-implemented method also includes selecting, via the simulation suggestion engine, at least one simulation tool based on the at least one characteristic. The computer-implemented method further includes causing simulation information related to the at least one simulation tool to be displayed at a client device via a graphical user interface.

At least one technical advantage of the disclosed techniques relative to the prior art is that the disclosed techniques enable a simulation suggestion engine to automatically analyze a computer-generated design and select one or more appropriate simulations for the design. In this regard, the simulation suggestion engine is configured to perform an analysis of the design, via one or more analysis tools, to determine at least one characteristic of the design, and then identify one or more suggested simulations for the design based on the at least one characteristic of the design. Simulation information related to the at least one suggested simulation tool is then displayed to the user. Thus, novice users can automatically receive information for simulations appropriate for their designs without having to rely on their own limited knowledge and experience. In this manner, the proper simulations for a design can be identified, selected, and performed to ensure that a design is sufficient for the intended purpose/function of the design. Another technical advantage relative to the prior art is that the simulation suggestion engine automatically determines and load simulation parameters (boundary conditions) for the one or more suggested simulations. Thus, novice users also do not have to rely on their own limited knowledge and experience in setting up a simulation. These technical advantages represent one or more technological advancements over prior art approaches.

BRIEF DESCRIPTION OF THE DRAWINGS

So that the manner in which the above recited features of the various embodiments can be understood in detail, a more particular description of the inventive concepts, briefly summarized above, may be had by reference to various embodiments, some of which are illustrated in the appended drawings. It is to be noted, however, that the appended drawings illustrate only typical embodiments of the inventive concepts and are therefore not to be considered limiting of scope in any way, and that there are other equally effective embodiments.

DETAILED DESCRIPTION

Figure 1:
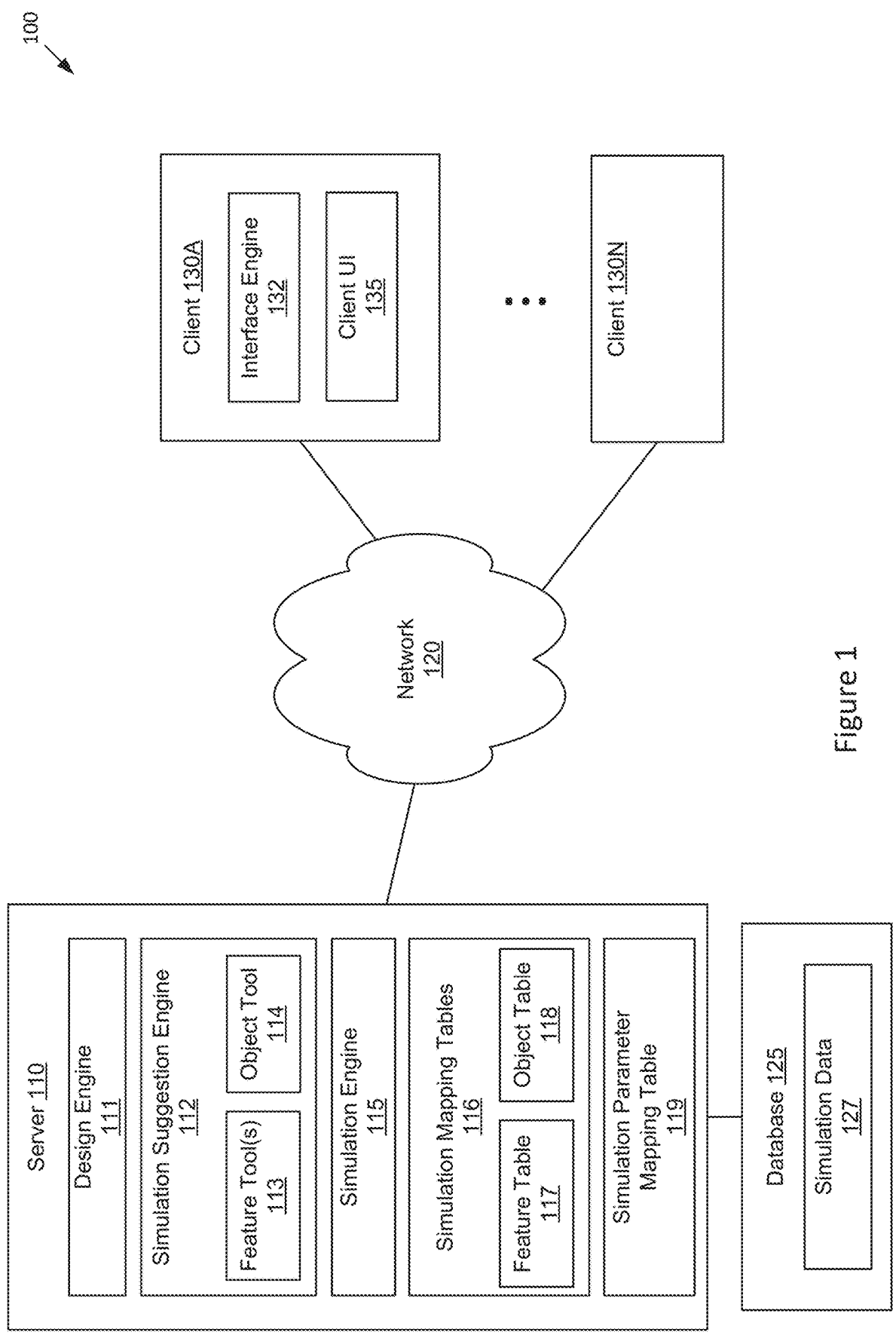
FIG. 1 illustrates a simulation suggestion system configured to implement one or more aspects of the various embodiments.

In the following description, numerous specific details are set forth to provide a more thorough understanding of the various embodiments. However, it will be apparent to one of skilled in the art that the inventive concepts may be practiced without one or more of these specific details.

As disclosed in the embodiments herein, a computer system (such as a server system or client device) executes a design engine for generating designs, a simulation suggestion engine for identifying suggested simulations for the designs, and a simulation engine for performing the suggested simulations on the designs. The simulation engine includes one or more simulation tools for performing one or more suggested simulations on a design. A user generates/completes a design of an object via the design engine. For example, the user may design a three dimensional (3D) model of a car component via the design engine. After the design is completed, the simulation suggestion engine automatically identifies one or more simulations/simulation tools that are appropriate for the completed design. Optionally, the simulation suggestion engine may further automatically identify and load simulation parameters (boundary conditions) for the one or more suggested simulations/simulation tools. The one or more suggested simulations/simulation tools are then performed/executed on the completed design via the simulation engine.

In some embodiments, the simulation suggestion engine operates in three phases: an analysis phase, a simulation suggestion phase, and an optional simulation parameters phase. In the analysis phase, the simulation suggestion engine executes a set of one or more analysis tools to determine a set of one or more characteristics of the design. The set of analysis tools include one or more different feature detection tools, each feature detection tool being configured to detect one or more predetermined features of the design. In other embodiments, the set of analysis tools include a plurality of different feature detection tools, each feature detection tool configured to detect one or more different types of feature in the design. In these embodiments, determining the at least one characteristic of a design comprises determining that the design includes at least one predetermined feature. In other embodiments, the set of analysis tools include an object detection tool configured to identify the object being represented in the design (the type of object being designed). In some embodiments, the object detection tool is trained using machine learning techniques to identify various types of objects that are commonly designed. In these embodiments, determining the at least one characteristic of a design comprises determining the type of object represented in the design (the type of object that is designed). The set of analysis tools may include at least one feature detection tool and/or the object detection tool.

In the simulation suggestion phase, the simulation suggestion engine identifies one or more suggested simulations/simulation tools based on the at least one characteristic determined in the analysis phase. In some embodiments, the simulation suggestion engine identifies one or more suggested simulations/simulation tools for each characteristic determined in the analysis phase. The simulation suggestion engine may do using one or more simulation mapping tables. In some embodiments, a simulation mapping table comprises a feature mapping table comprising a plurality of entries, each entry mapping a predetermined feature to one or more suggested simulations/simulation tools for the predetermined feature. For each predetermined feature that is detected in the design during the analysis phase, the simulation suggestion engine determines one or more corresponding simulations/simulation tools for the predetermined feature via the feature mapping table. In other embodiments, a simulation mapping table comprises an object mapping table comprising a plurality of entries, each entry mapping a type of object to one or more suggested simulations/simulation tools for the type of object. After the type of object represented in the design is identified during the analysis phase, the simulation suggestion engine then determines one or more corresponding simulations/simulation tools for the object type via the object mapping table.

In the optional simulation parameters phase, the simulation suggestion engine automatically determines and loads a set of simulation parameters for each of the one or more suggested simulations/simulation tools. In this phase, the simulation suggestion engine may implement the object detection tool to identify the type of object represented in the design. However, if the object detection tool was previously used in the analysis phase, the type of object that is designed should already be identified and this step can be omitted. The simulation suggestion engine then determines a set of simulation parameters for each suggested simulation/simulation tool based on the identified object type. The simulation suggestion engine then automatically initiates the simulation engine and each suggested simulation tool of the simulation engine, and load a set of simulation parameters to each suggested simulation tool. The one or more suggested simulation tools are then executed on the design via the simulation engine.

Simulation Suggestion System

FIG. 1 illustrates a simulation suggestion system 100 configured to implement one or more aspects of the various embodiments. As shown, the simulation suggestion system 100 includes a server 110 and a plurality of clients 130 (e.g., 130A-130N) coupled via a network 120. Each client 130 is associated with and corresponds to a particular user who operates the client 130. The network 120 may comprise any technically feasible communications or information network, wired or wireless, that allows data exchange, such as a wireless (W-Fi) network, personal area network (such as Bluetooth, Wireless USB, IrDA, etc.), wide area network (WAN), a local area network (LAN), and/or the Internet, among others.

In at least one practical application, the disclosed techniques may be implemented via a cloud-based service that implements a cloud server 110 connected to a plurality of clients 130 (e.g., subscribers of the cloud-based service) via a network. The cloud server may execute a design engine for generating designs, a simulation suggestion engine for identifying suggested simulations for the designs, and a simulation engine for performing the suggested simulations on the designs. Each client 130 may interface with the cloud server 110 to access the services of the design engine, simulation suggestion engine, and simulation engine provided by the cloud server to perform embodiments herein. In another practical application, the disclosed techniques may be implemented via a client device that executes the design engine, simulation suggestion engine, and simulation engine for performing the embodiments herein.

The server 110 may comprise a computing device or machine, such as a server system, desktop computer, laptop computer, or any other type of computing device suitable for practicing various embodiments. The client 130 may comprise a computing device or machine, such as a desktop computer, laptop computer, mobile device, or any other type of computing device suitable for practicing various embodiments. The server 110 and client 130 comprise computer hardware components such as memory for storing software application(s) and data and processors that execute the software application(s) to provide processing engines that enable the operations and functions described herein. The computer hardware components of the server 110 and client 130 are discussed below in relation to FIGS. 12-13.

The server 110 executes various engines (design engine 111, simulation suggestion engine 112, and simulation engine 115) and stores various mapping tables (simulation mapping tables 116 and simulation parameter mapping table 119) for performing embodiments herein. The server 110 is connected to a database 125 that stores a repository of previous designs of objects and simulation data 127 for previous simulations performed on the previous designs of objects. The simulation data 127 includes information associated with or describing the previously performed simulations, such as previous designs of objects, which simulations were performed for particular types of designed objects, and simulation parameters previously used for the simulations performed on the particular types of designed objects.

The design engine 111 executing on the server 110 is accessed by a client/user 130 to generate and complete a design (e, 3D model) of an object, such as a car component, thermal component, chair, coffee mug, etc.). The design engine 111 comprises any type of computer-based software application or suite. For example, the design engine 111 may comprise any type of design and/or engineering-based applications, such as a computer-aided design (CAD) application, computer-aided engineering (CAE) application, modeler application, geometry generator application, a software engineering suite, or the like.

The simulation engine 115 comprises various simulation tools for performing various simulations on completed designs of objects. A simulation tool tests the structural and/or functional performance of a design to determine if the design is sufficient for the intended purpose/function of the design and is structurally adequate for the intended purpose/function. In general, a simulation tool is configured to test the structural and/or functional performance of a design in relation to a specific structural and/or functional aspect of the design, as specified by predetermined goals and standards. Thus, different simulation tools are configured to test the structural and/or functional performance of a design in relation to different structural and/or functional aspects of the design. Examples of simulation tools include a structural buckling simulation, a linear static simulation, a modal frequency simulation, automated simulation, automated finite element analysis (FEA) simulation, automated finite element method (FEM) simulation, and the like. In other embodiments, other simulation tools may be used.

The server 110 executes the simulation suggestion engine 112 to automatically analyze the object design (in an analysis phase) and the identify one or more suggested simulations/simulation tools of the simulation engine 115 based on the analysis (in a simulation suggestion phase). To perform the analysis phase, the simulation suggestion engine 112 includes one or more feature detection tools 113 and/or an object detection tool 114 that detect at least one characteristic of the design. To perform the simulation suggestion phase, the simulation suggestion engine 112 accesses the simulation mapping tables 116, such as a feature mapping table 117 and/or an object mapping table 118, to map the at least one characteristic of the design to one or more suggested simulations/simulation tools. To perform an optional simulation parameters phase, the simulation suggestion engine 112 also automatically executes/applies the object detection tool 114 to determine the type of object represented in the design and access the simulation parameter mapping table 119 to map the identified object type to a set of simulation parameters. The simulation suggestion engine 112 may automatically initiate the one or more suggested simulation tools of the simulation engine 115 and load the set of simulation parameters to the one or more suggested simulation tools. As used herein, a "table" may comprise any type of data container, such as a data file, document, or the like.

Each client device 130 may connect to the IP address of the server 110 and logon to the server 110 by submitting a login name and/or password. Each client device 130 executes an interface engine 132 that acts as an interface between the client device 130 and the various engines executing on the server 110 to perform embodiments described herein. In particular, the interface engine 132 interacts with the design engine 111, simulation suggestion engine 112, and simulation engine 115 executing on the server 110 via the network 120. When executed, the interface engine 132 generates and displays a client user interface (UI) 135 to perform embodiments herein. An end-user may enter inputs (such as selections and commands) to the client device 130 via the client UI 135. The various engines executing on the server 110 may receive the user inputs via the client UI 135 and the network 120, and in response, transmit corresponding outputs to the interface engine 132, which presents the output to the end-user via the client UI 135. For example, the interface engine 132 may comprise a web-browser application that includes a software plug-in that allows the web-browser to interact with the various engines (design engine 111, simulation suggestion engine 112, and simulation engine 115) of the server 110.

As described above, the simulation suggestion system 100 may be implemented in a cloud computing environment that implements a cloud server 110 connected to a plurality of clients 130 (e.g., subscribers of the cloud-based service) via the network 120. The cloud computing environment provides scalable computing resources as a cloud-based service over a network. Various services provided by the engines of the server 110 may be provided to clients/users 130 through a cloud computing infrastructure. In other embodiments, the client device 130 executes the various engines (design engine 111, simulation suggestion engine 112, and simulation engine 115) and stores the various mapping tables (simulation mapping tables 116 and simulation parameter mapping table 119) for performing embodiments herein. In these embodiments, the client device 130 directly provides services to the user and the user interacts directly with the client device 130 without use of a server 110 for performing the embodiments herein.

Analysis Phase

Figure 2:
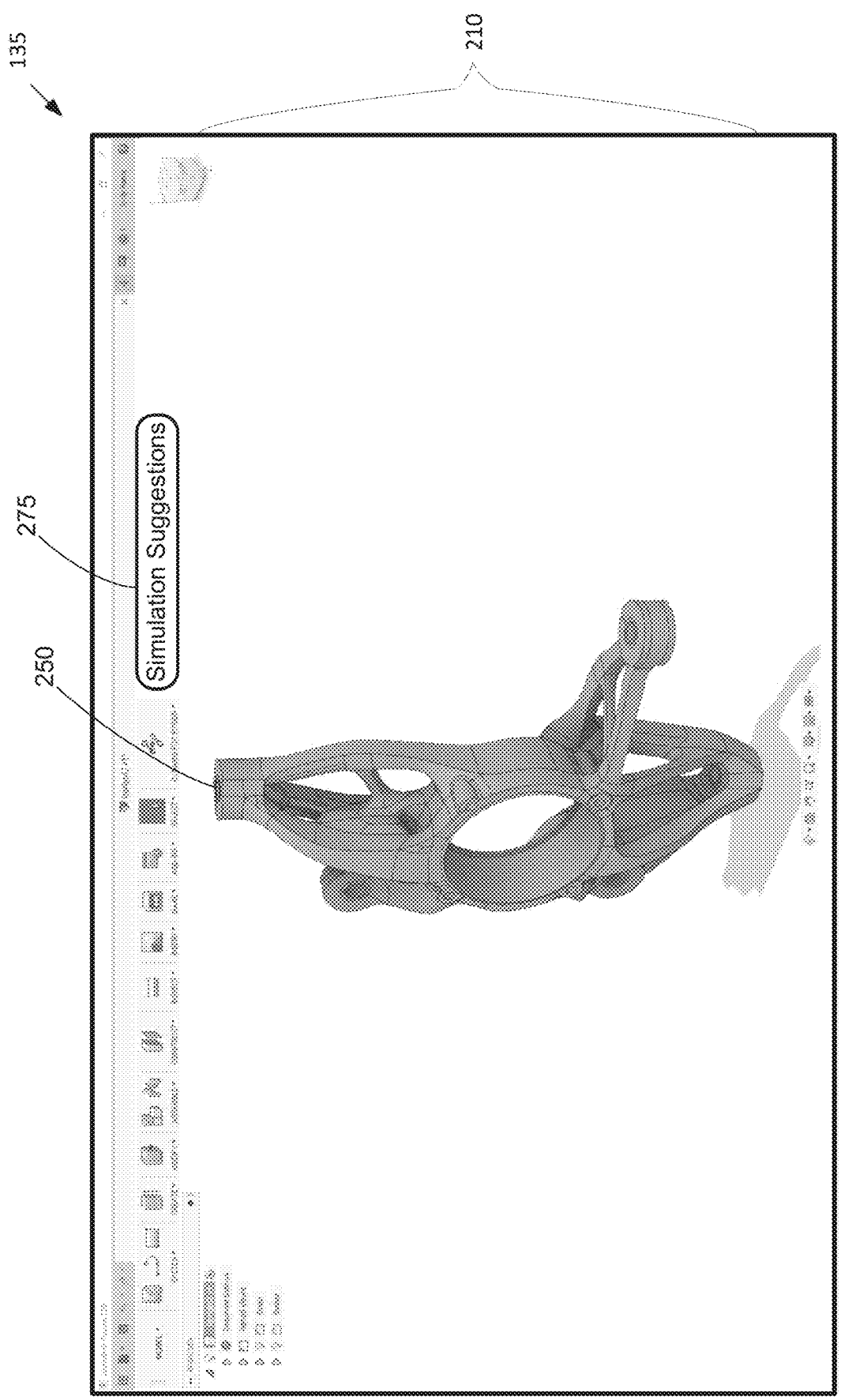
FIG. 2 is an exemplary screenshot of the client user interface (UI) of FIG. 1 in which a computer-generated design is displayed, according to various embodiments.

A client/user 130 may generate and complete a design via the design engine 111 executing on the server 110. For example, the user may create a 3D model of an object. The completed design of the object may be received by the interface engine 132 of the client 130 and displayed to the user via the client UI 135. FIG. 2 is an exemplary screenshot of the client user interface (UI) of FIG. 1 in which a computer-generated design is displayed, according to various embodiments. In the example of FIG. 2, the type of object 250 represented in the design 210 comprises a car suspension component. As shown, the client UI 135 also displays a user-selectable "Simulation Suggestions" button 275. Receiving a user selection of the "Simulation Suggestion" button 275 indicates that the currently displayed design 210 is complete and the user wishes to receive suggestions for simulations recommended for the completed design 210.

The user selection of the "Simulation Suggestions" function/button 275 is received by the simulation suggestion engine 112 from the client 130 via the client UI 135. In response, the simulation suggestion engine 112 performs the analysis phase by implementing a set of one or more analysis tools to determine a set of one or more characteristics of the design 210. In some embodiments, the set of analysis tools may include at least one feature detection tool 113. In other embodiments, set of analysis tools may include an object detection tool 114. In further embodiments, set of analysis tools may include at least one feature detection tool 113 and the object detection tool 114.

Each feature detection tool in the set of analysis tools is configured to detect one or more predetermined features of the design. In these embodiments, determining the at least one characteristic of the design comprises determining that the design includes at least one predetermined feature. In some embodiments, a predetermined feature of a design comprises a specific geometric characteristic of the overall object that is designed or a sub-portion of the object that is designed. In these embodiments, the feature detection tool comprises a geometry-based analysis tool.

Figure 3:
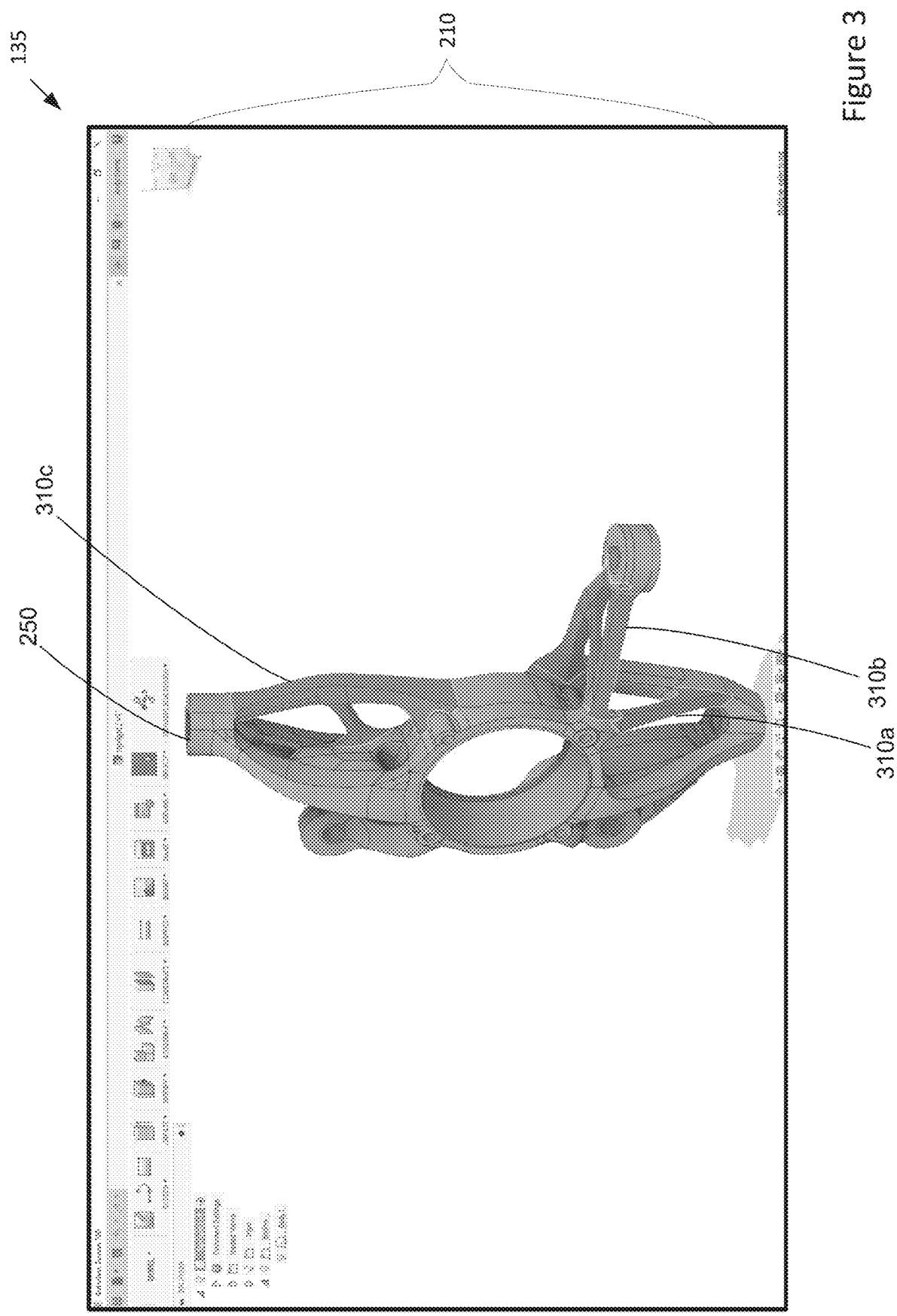
FIG. 3 is an exemplary screenshot of the client user interface (UI) of FIG. 1 in which results of a feature analysis of a design are displayed, according to various embodiments.

For example, a feature detection tool 113 may comprise an aspect ratio tool configured to detect any features in the design having a relatively high aspect ratio. In particular, an aspect ratio tool is configured to detect any features in the design having an aspect ratio (length/width) that is above a threshold value (e.g., 25:1 ratio). A feature in the design having an aspect ratio above the threshold value is referred to as a "thin feature" or "slender feature." FIG. 3 is an exemplary screenshot of the client user interface (UI) of FIG. 1 in which results of a feature analysis of a design are displayed, according to various embodiments. In the example of FIG. 3, an aspect ratio tool has been applied to the design 210 and detected several thin/slender features 310a-c (as indicated by the different shading) in the design 210. As shown, each detected thin/slender feature 310 comprises a sub-portion of the object 250 that is designed.

As discussed below, if the feature detection tool detects that the design includes at least one thin feature (the at least one characteristic of the design), the simulation suggestion engine 112 identifies at least one simulation appropriate for a design with thin features, such as a structural buckling simulation.

In other embodiments, the set of analysis tools includes an object detection tool 114 configured to identify the object being represented in the design (the type of object being designed). The object detection tool may be trained using machine learning techniques to identify various types of objects that are commonly designed. In these embodiments, determining the at least one characteristic of a design comprises determining the type of object represented in the design (the type of object that is designed). Thus, the object detection tool may analyze and identify the overall object that is represented in the design, rather than analyze specific sub-portions of the object for various predetermined features (as done by the feature detection tools). Based on the type of object identified by the object detection tool 114, the simulation suggestion engine 112 identifies at least one simulation appropriate for the type of object being designed. For example, if the object detection tool 114 determines that the designed object comprises a heat sink, the simulation suggestion engine 112 may recommend a thermal simulation and/or a thermal stress simulation.

Figure 4:
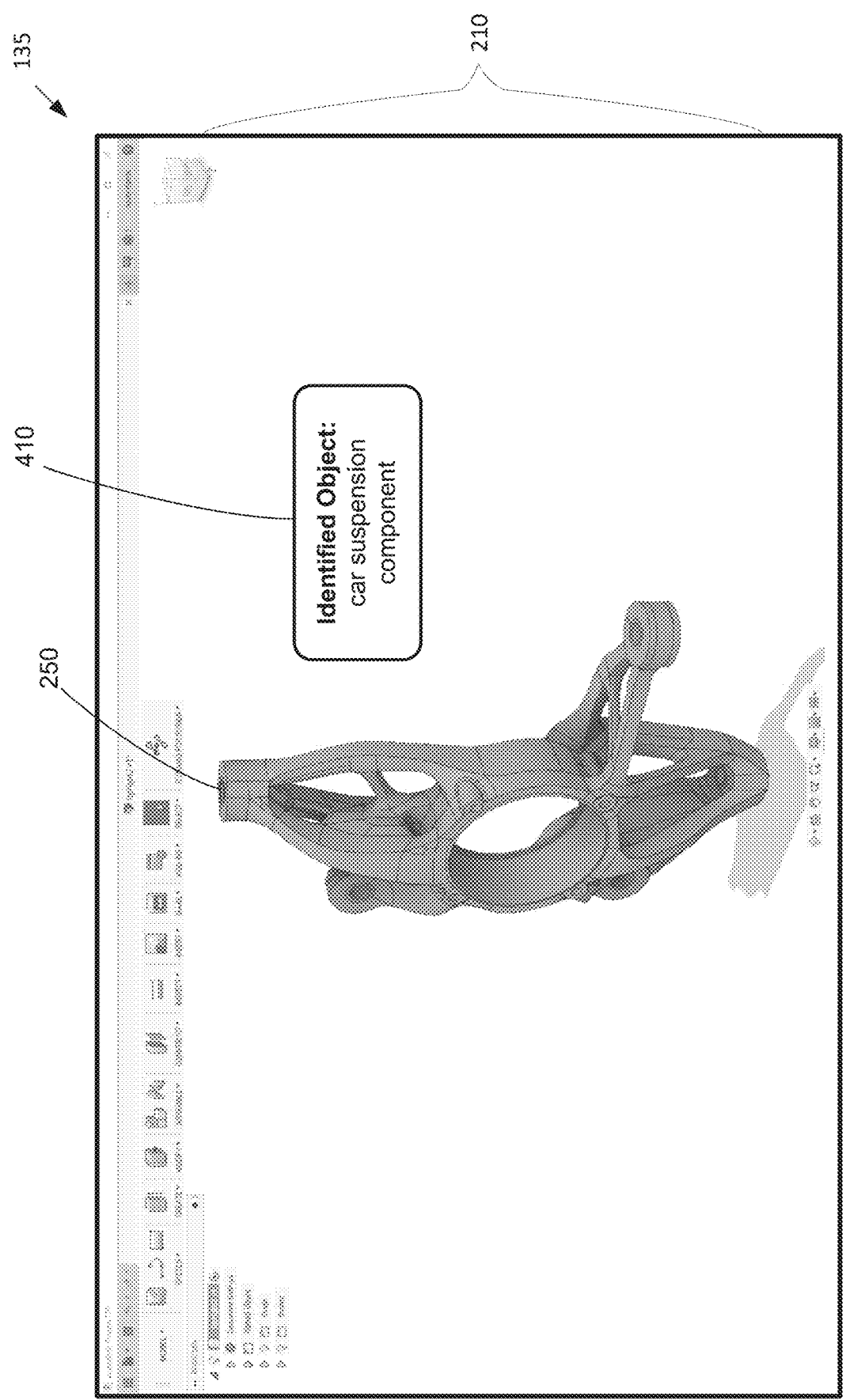
FIG. 4 is an exemplary screenshot of the client user interface (UI) of FIG. 1 in which results of an object analysis of a design are displayed, according to various embodiments.

FIG. 4 is an exemplary screenshot of the client user interface (UI) of FIG. 1 in which results of an object analysis of a design are displayed, according to various embodiments. In the example of FIG. 4, the object detection tool 114 has been applied to the design 210, which has detected that the object 250 in the design 210 comprises a car suspension component. In some embodiments, the client UI 135 may display an object identification box 410 displaying the determined identification of the object type represented in the design 210. As discussed below, if the object detection tool detects that the designed object 250 comprises a car suspension component (the at least one characteristic of the design), the simulation suggestion engine 112 identifies at least one simulation appropriate for a car suspension component, such as a modal frequency simulation.

The object detection tool 114 may comprise an algorithm that implements one or more machine learning functions. The object detection tool 114 may be trained using machine learning techniques to identify different types of designed objects that are commonly created, such as car components, electronic devices and components, thermal component, and the like. In machine learning training, the object detection tool 114 may learn how to identify designed objects through a training set of data that includes images of various designed objects. For example, the object detection tool 114 may be trained using the repository of previous designs of objects stored to the database 125 to be able to detect which type of object is included in a design.

Simulation Suggestion Phase

After the simulation suggestion engine 112 determines at least one characteristic of the design in the analysis phase, the simulation suggestion engine 112 then identifies one or more suggested simulations/simulation tools based on the at least one characteristic in a simulation suggestion phase. In some embodiments, the simulation suggestion engine 112 identifies one or more suggested simulations/simulation tools for each characteristic determined in the analysis phase. The simulation suggestion engine 112 further interacts with the client 130 to cause information ("simulation information") related to the one or more suggested simulations/simulation tools to be displayed at the client 130 via the client UI 135.

Figure 5:
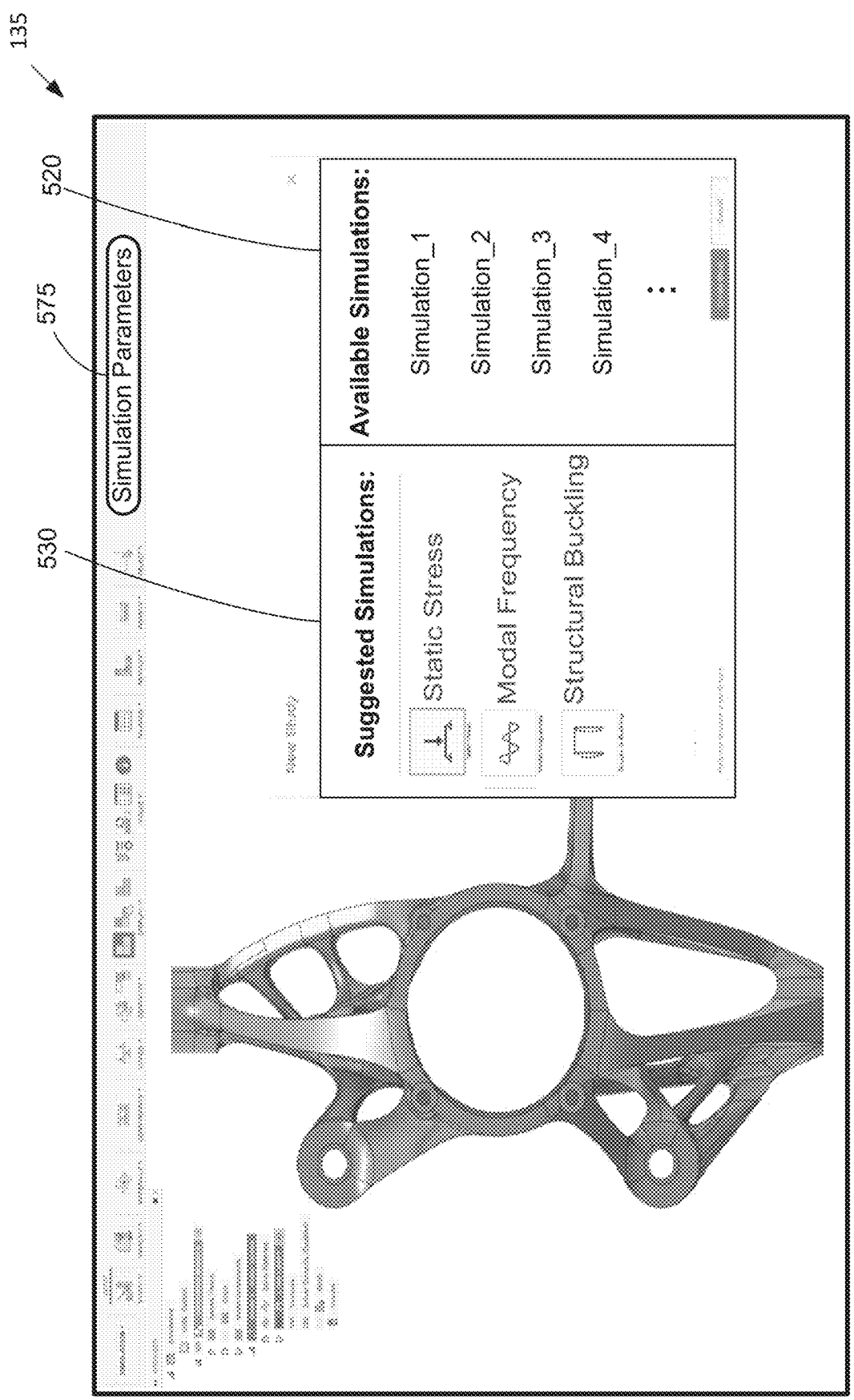
FIG. 5 is an exemplary screenshot of the client user interface (UI) of FIG. 1 in which suggest simulations for a design are displayed, according to various embodiments.

FIG. 5 is an exemplary screenshot of the client user interface (UI) of FIG. 1 in which suggest simulations for a design are displayed, according to various embodiments. As shown, the client UI 135 displays identification information for a set of available simulations/simulation tools 520. For example, the identification information for a simulation tool may include text identifying the simulation tool (g, the name of the simulation tool) and/or an icon that graphically represents the simulation tool. The set of available simulations/simulation tools 520 may include all the various simulations/simulation tools provided by the simulation engine 115. In other embodiments, the set of available simulations/simulation tools 520 may include simulations/simulation tools not provided by the simulation engine 115, but made available by other third party simulation applications or simulation suites.

In some embodiments, the client UI 135 also displays identification information for one or more suggested simulations/simulation tools 530 within the set of available simulations/simulation tools 520. For example, the client UI 135 displays, for each suggested simulation tool, text identifying the suggested simulation tool (e.g., the name of each suggested simulation tool) and/or an icon that graphically represents the suggested simulation tool. The identification information for the suggested simulation tools 530 may be referred to as simulation information relating to the at least one suggested simulation tool. As discussed below, the simulation information displayed in the client UI 135 may further include a set of simulation parameters for the at least one suggested simulation tool.

Figure 6:
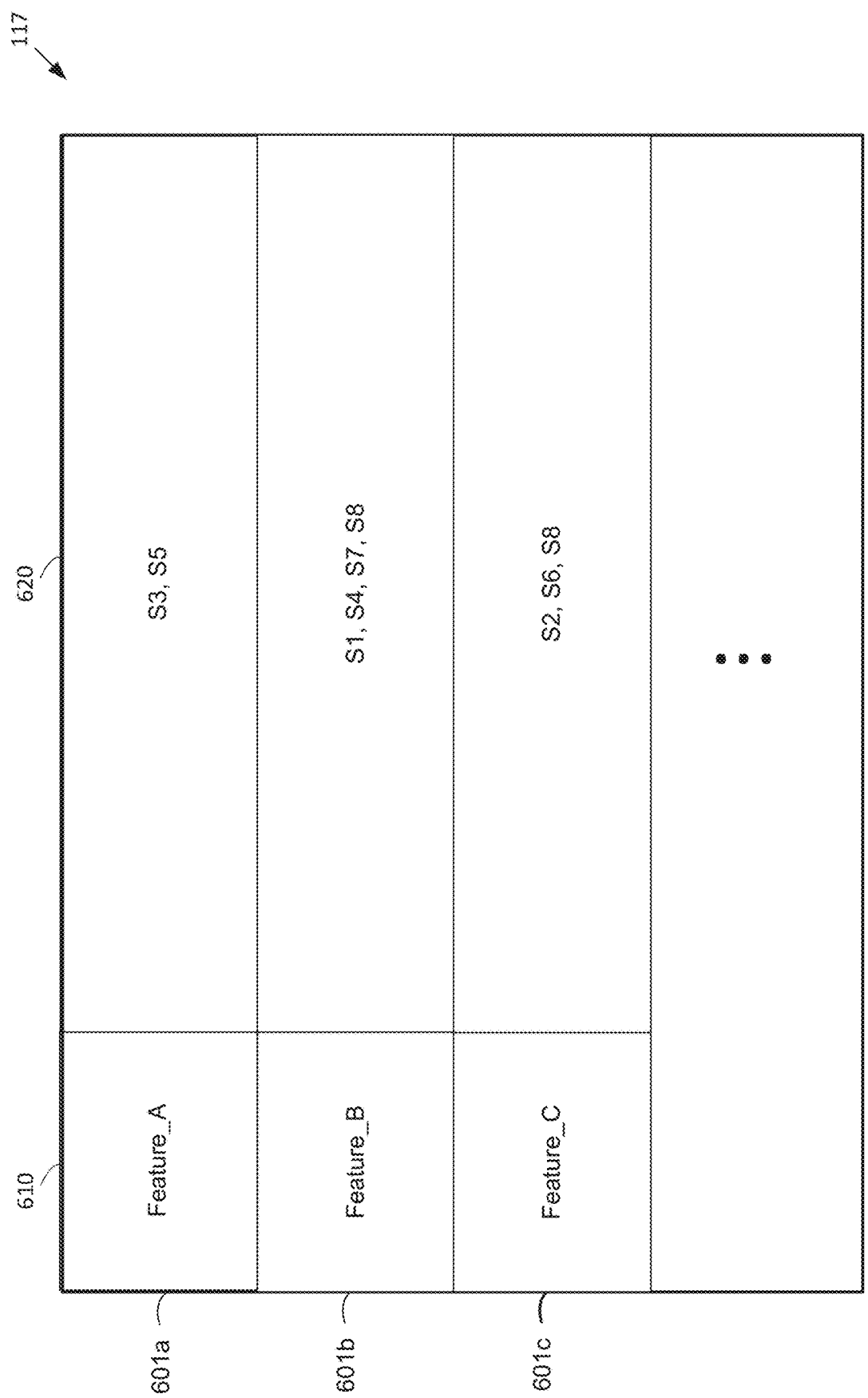
FIG. 6 is a conceptual diagram of the feature mapping table of FIG. 1, according to various embodiments.

The simulation suggestion engine 112 may identify the one or more suggested simulation tools using a set of one or more simulation mapping tables 116. In some embodiments, if at least one feature detection tool 113 is used in the analysis phase, the set of simulation mapping tables 116 includes a feature mapping table 117. FIG. 6 is a conceptual diagram of the feature mapping table of FIG. 1, according to various embodiments. In some embodiments, for each predetermined feature (characteristic of the design) that is detected in the design by a feature detection tool 113 during the analysis phase, the simulation suggestion engine 112 may determine one or more corresponding simulations/simulation tools for the predetermined feature via the feature mapping table 117. As shown, the feature mapping table 117 comprises a plurality of entries 601 (such as 601a, 601b, 601c, etc.), each entry 601 comprising a mapping from a specific predetermined feature 610 to one or more suggested simulation tools 620 for the predetermined feature 610. Each predetermined feature 610 may be identified by a unique identifier (such as Feature_A, Feature_B, Feature_C, etc.). Each available simulation/simulation tool may be identified by a unique identifier (such as S1, S2, S3, etc.), whereby each entry 601 specifies the unique identifiers for the one or more suggested simulations/simulation tools 620 corresponding to a predetermined feature 610. For example, the feature mapping table 117 may include an entry 601 for a predetermined feature 610 comprising a thin/slender feature, which maps to one or more suggested simulation tools 620 including a structural buckling simulation and a linear static simulation.

Figure 7:
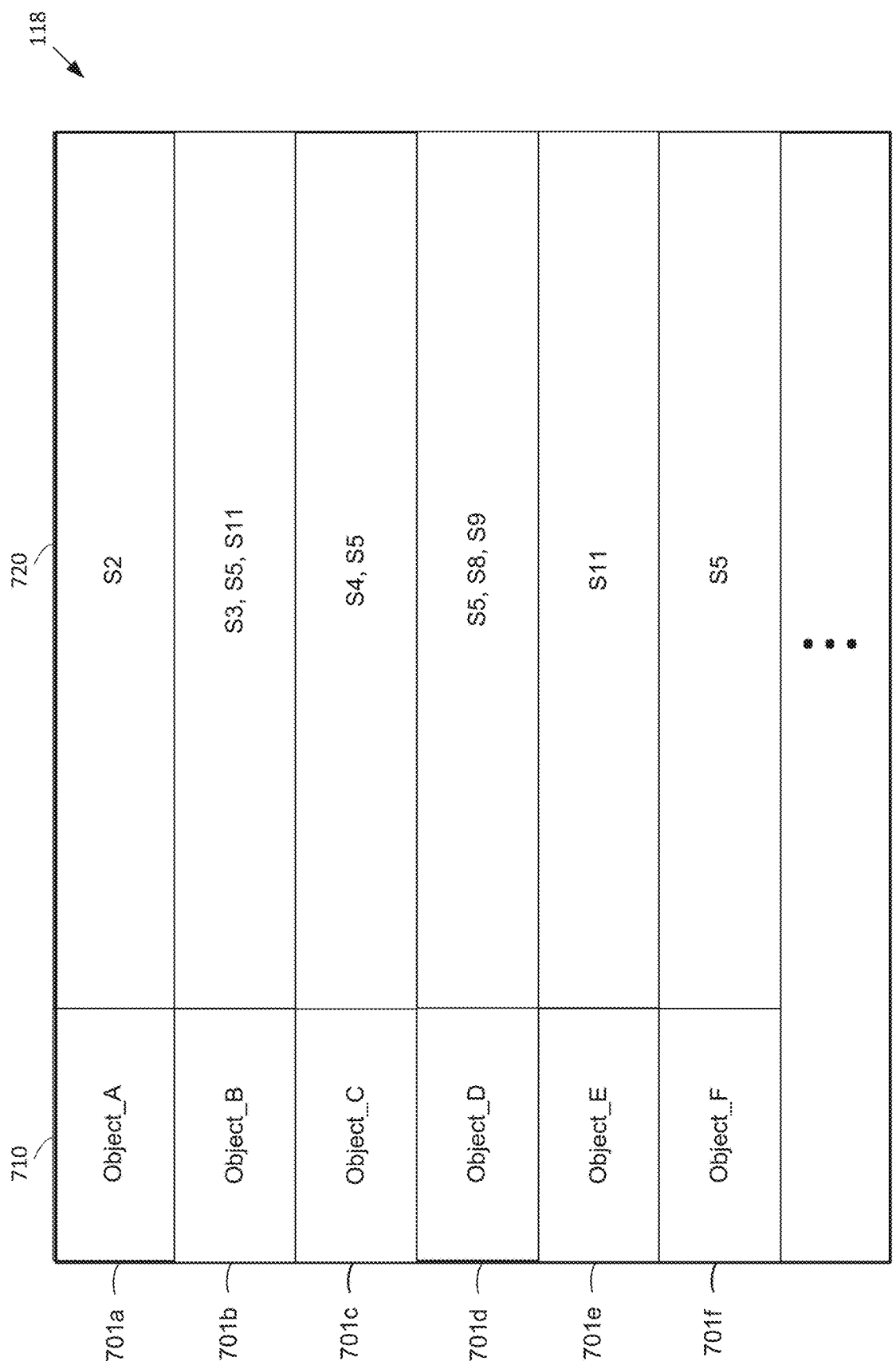
FIG. 7 is a conceptual diagram of the object mapping table of FIG. 1, according to various embodiments.

In other embodiments, if the object detection tool 114 is used in the analysis phase, the set of simulation mapping tables 116 includes an object mapping table 118. FIG. 7 is a conceptual diagram of the object mapping table of FIG. 1, according to various embodiments. For the object type (characteristic of the design) that is identified in the design by the object detection tool 114 during the analysis phase, the simulation suggestion engine 112 determines one or more corresponding simulations/simulation tools for the object type via the object mapping table 118. As shown, the object mapping table 118 comprises a plurality of entries 701 (such as 701a, 701b, 701c, etc.), each entry 701 comprising a mapping from a particular object type 710 to one or more suggested simulation tools 720 for the object type 710. Each object type 710 may be identified by a unique identifier (such as Object_A, Object_B, Object_C, etc.). Each available simulation/simulation tool may be identified by a unique identifier (such as S1, S2, S3, etc.), whereby each entry 701 specifies the unique identifiers for the one or more suggested simulations/simulation tools 720 corresponding to an object type 710.

For example, the object mapping table 118 may include an entry 701 for an object type 710 comprising a car suspension component, which maps to one or more suggested simulation tools 720 including a modal frequency simulation that is commonly used for components that are to be used in dynamic environments and experience significant vibration and/or dynamic loading during use. As another example, the object mapping table 118 may include an entry 701 for an object type 710 comprising a heat sink (a thermal component), which maps to one or more suggested simulation tools 720 including a thermal simulation and a thermal stress simulation. As another example, the object mapping table 118 may include an entry 701 for an object type 710 comprising a component that needs to fail safely and/or absorb energy, which maps to one or more suggested simulation tools 720 including a non-linear static simulation.

As described above, one or more analysis tools may be used in the analysis phase to determine one or more characteristics of the design. In some embodiments, if one or more feature detection tools 113 are used in the analysis phase, the simulation suggestion engine 112 implements the feature mapping table 117 to map one or more simulation tools for each predetermined feature detected in the design by the one or more feature detection tools 113. In other embodiments, if the object detection tool 114 is used in the analysis phase, the simulation suggestion engine 112 implements the object mapping table 118 to map one or more simulation tools for the object type identified in the design by the object detection tool 114. In further embodiments, if at least one feature detection tool 113 and the object detection tool 114 are used in the analysis phase, the simulation suggestion engine 112 implements the feature mapping table 117 to map one or more simulation tools for each predetermined feature detected in the design, and also implements the object mapping table 118 to map one or more simulation tools for the object type identified in the design.

The feature mapping table 117 and the object mapping table 118 may be generated, for example, based on the knowledge and experience of expert users, and/or based on previous simulations that have been performed on previous designs. For example, the mappings between the predetermined features to suggested simulation tools in the feature mapping table 117 may be determined based on the knowledge and experience of expert users (e.g., knowledge that a buckling simulation should be performed when a design contains thin features). For example, the mappings between an object type to suggested simulation tools in the object mapping table 118 may be determined based on previous simulations that have been performed on the previous designs of the same object type. As described above, the database 125 may store a repository of simulation data 127 that includes information associated with or describing the previously performed simulations, such as which simulations were performed for particular types of designed objects. The simulation data 127 may be leveraged to specify one or more suggested simulations to be performed for a particular object type in the object mapping table 118.

Simulation Parameters Phase

In the simulation suggestion phase, the simulation suggestion engine 112 identifies at least one suggested simulation tool for the design in the simulation suggestion phase. In general, a set of simulation parameters may be loaded to a simulation tool to perform a simulation on a design. Typically, the user must have knowledge and experience to determine the appropriate simulation parameters and the values for the simulation parameters so that the simulation tool can accurately test the design for its intended purpose. However, most users are not experienced enough to know the appropriate simulation parameters and the values for the simulation parameters for a particular design, which can result in improper/incorrect testing of the design for its intended purpose.

In some embodiments, after the simulation suggestion engine 112 identifies and displays information for the at least one suggested simulation tool in the simulation suggestion phase, the simulation suggestion engine 112 may then perform an optional simulation parameters phase. In the simulation parameters phase, the simulation suggestion engine 112 automatically determines and loads a set of simulation parameters (and corresponding values for the simulation parameters) for each of suggested simulation/simulation tool. Thus, novice users do not have to rely on their own limited knowledge and experience in setting up a simulation tool for a particular design. Rather, implementation of the simulation suggestion engine 112 ensures that the suggested simulation tools for a design are automatically and properly setup for the design.

Referring back to FIG. 5, the client UI 135 also displays a user-selectable "Simulation Parameters" button 575. A user selection of the "Simulation Parameters" button 575 indicates that the user wishes to have the simulation parameters for the at least one suggested simulation tool to be automatically determined and loaded into the at least one suggested simulation tool. When the simulation suggestion engine 112 receives the selection of the "Simulation Parameters" button 575 from the client 130 via the client UI 135, in response, the simulation suggestion engine 112 performs the simulation parameters phase. In other embodiments, the simulation parameters phase may be performed by the simulation suggestion engine 112 after the simulation suggestion phase without receiving the user selection of the "Simulation Parameters" button 575 from the client 130.

In the simulation parameters phase, the simulation suggestion engine 112 implements the object detection tool 114 to identify the type of object represented in the design. However, if the object detection tool 114 was previously used in the analysis phase, the object type in the design is already identified and this step may be omitted. For the object type that is identified in the design by the object detection tool 114, the simulation suggestion engine 112 then determines a set of simulation parameters and values for the parameters for the object type via the simulation parameter mapping table 119.

Figure 8:
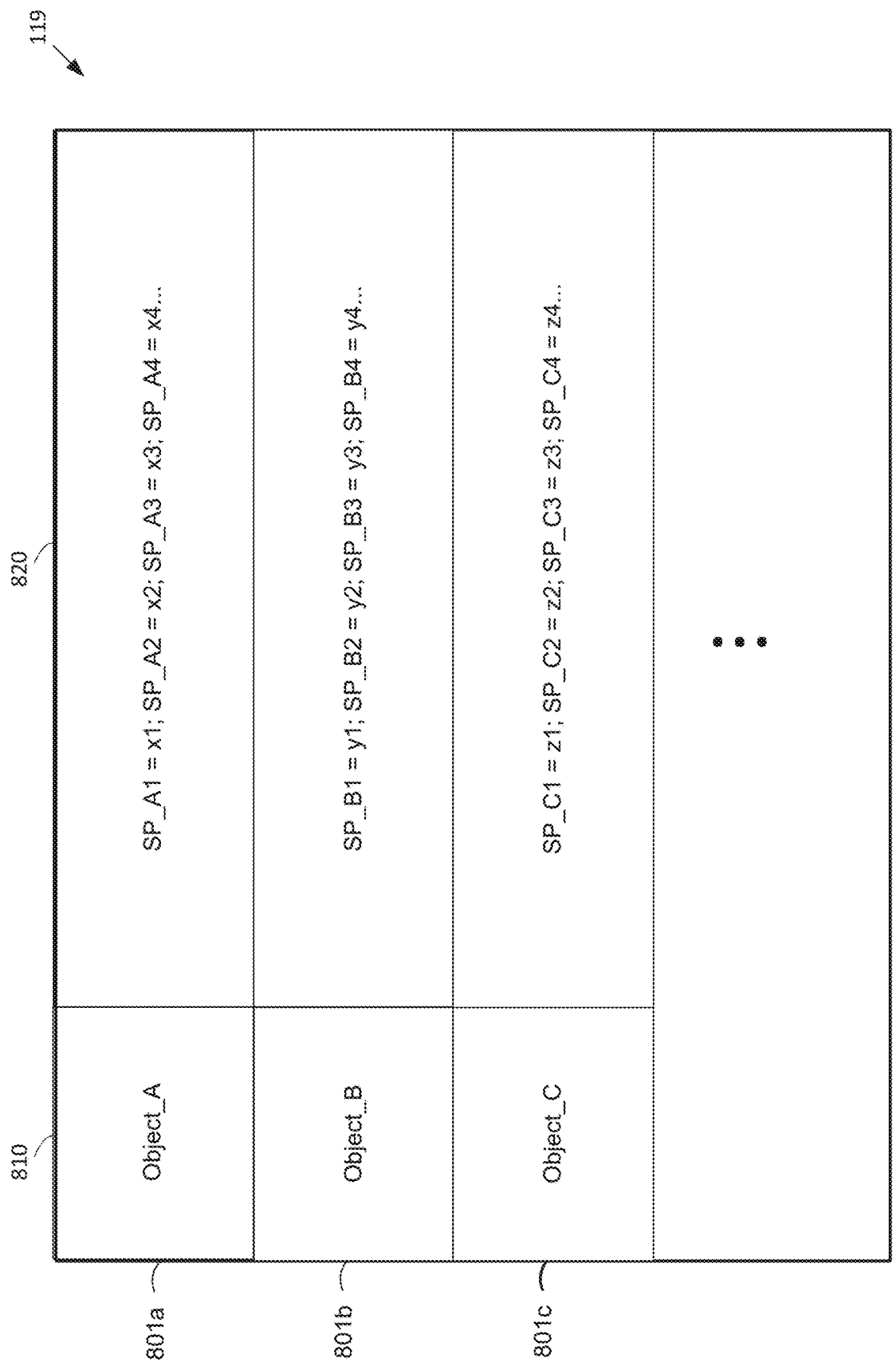
FIG. 8 is a conceptual diagram of an simulation parameter mapping table of FIG. 1, according to various embodiments.

FIG. 8 is a conceptual diagram of a simulation parameter mapping table of FIG. 1, according to various embodiments. As shown, the simulation parameter mapping table 119 comprises a plurality of entries 801 (such as 801a, 801b, 801c, etc.), each entry 801 comprising a mapping from a particular object type 810 to a set of simulation parameters 820 for the object type 810. Each object type 810 may be identified by a unique identifier (such as Object_A, Object_B, Object_C, etc.). Each simulation parameter may be identified by a unique identifier (such as S1_A1, S2_A2, S3_A3, etc.). Each entry 801 further specifies a value for each simulation parameter (such as x1, x2, x3, etc.). For example, the simulation parameter mapping table 119 may include an entry 801 for an object type 810 comprising a car suspension component, which maps to a set of simulation parameters 820.

The set of simulation parameters for a design comprises boundary conditions for the design that are input to a simulation tool for testing the design. The types of boundary conditions and the values for each boundary conditions typically varies based on the type of object that is designed. For example, the boundary conditions and corresponding values for a car suspension component is different than the boundary conditions and corresponding values for a heat sink. Examples of simulation parameters (boundary conditions) include loads/applied forces, moments, constraints, displacement, remote force, bearing load, pressure, transient load (time based load), thermal parameters (temperature, heat flux, convection, radiation), and the like.

The simulation parameter mapping table 119 may be generated, for example, based on the knowledge and experience of expert users, industry standards, and/or previous simulations that have been performed on previous designs. In particular, the set of simulation parameters for each particular object type listed in the simulation parameter mapping table 119 may be determined, for example, based on expert users, industry standards, and/or previous simulations that have been performed on previous designs. The set of simulation parameters for an object type may be determined based on industry standards established for the object type. For example, thermal-based objects (such as heat sinks) must meet certain minimum thermal requirements that may be specified through a set of simulation parameters. The set of simulation parameters are then input to a thermal simulation that can determine if the designed object satisfies these minimum thermal requirements. The set of simulation parameters for an object type may also be determined based on previous simulations that have been performed on the previous designs of the same object type. As described above, the database 125 may store a repository of simulation data 127 that includes information associated with or describing the previously performed simulations, such as which simulation parameters and values were used for particular types of designed objects in previous simulations. The simulation data 127 may be leveraged to determine a set of simulation parameters for different object types listed in the simulation parameter mapping table 119.

In other embodiments, the object detection tool 114 may be implemented to determine the set of simulation parameters for a designed object. In these embodiments, the object detection tool 114 may implement machine learning functionality that is trained on previously designed objects and previous simulation parameters and value for the previously designed objects. The object detection tool 114 may then infer simulation parameters and corresponding values for a new designed object with different performance and weight requirements based on similar previously designed objects. If the object detection tool 114 determines the intended performance of the new designed object is less than, between, or greater than the similar previously designed objects, the object detection tool 114 may accordingly determine the new simulation parameters and corresponding values required for the new designed object.

Figure 9:
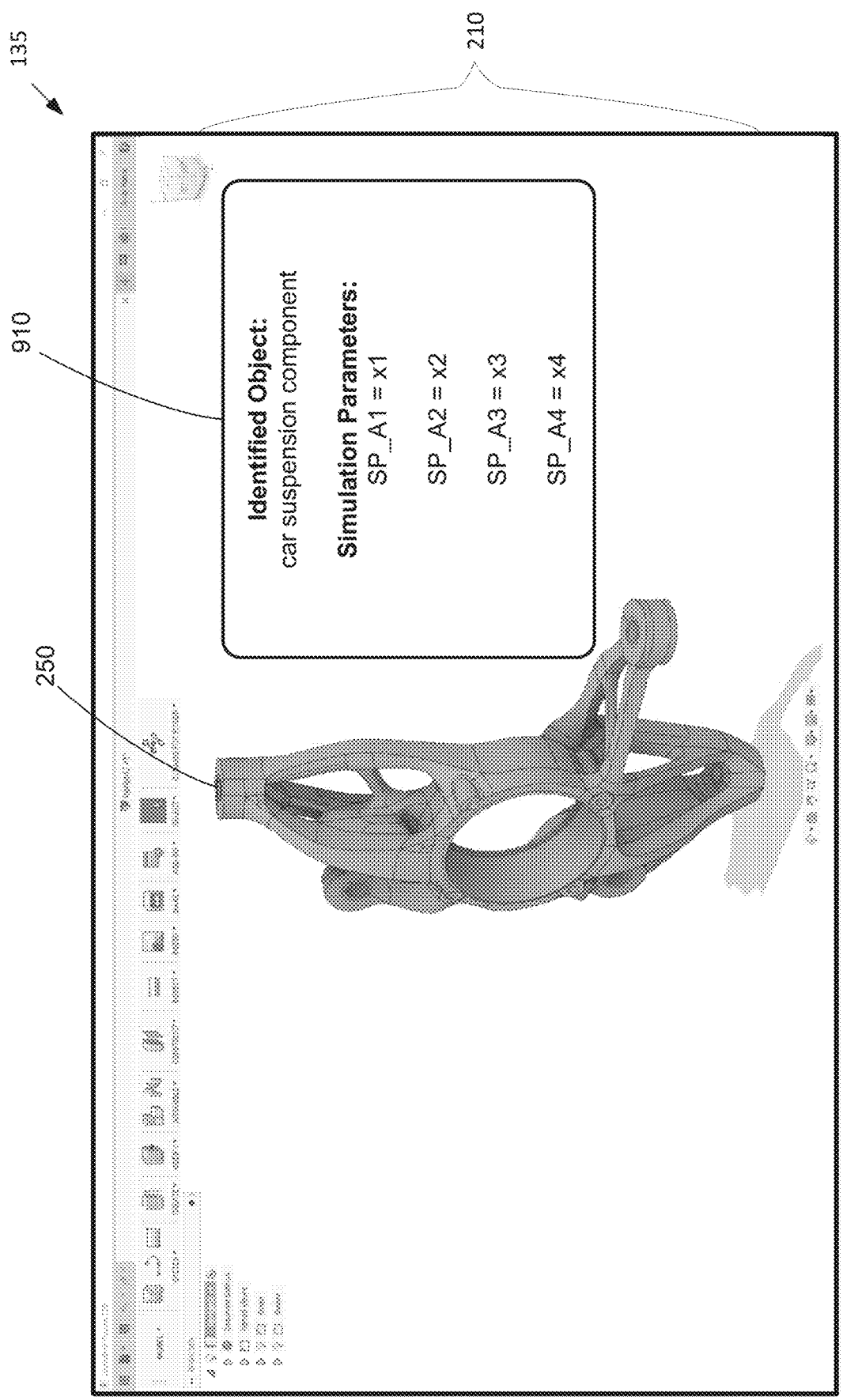
FIG. 9 is an exemplary screenshot of the client user interface (UI) of FIG. 1 in which simulation parameters for a design are displayed, according to various embodiments.

FIG. 9 is an exemplary screenshot of the client user interface (UI) of FIG. 1 in which simulation parameters for a design are displayed, according to various embodiments. In the example of FIG. 9, the object detection tool 114 has been applied to the design 210, which has detected that the object 250 in the design 210 comprises a car suspension component. The simulation suggestion engine 112 then accesses the simulation parameter mapping table 119 to determine a set of simulation parameters for a car suspension component. In some embodiments, the client UI 135 may display a simulation parameter box 910 displaying simulation information comprising the identification of the object type represented in the design 210 and the set of simulation parameters and corresponding values determined for the object type.

Figure 10:
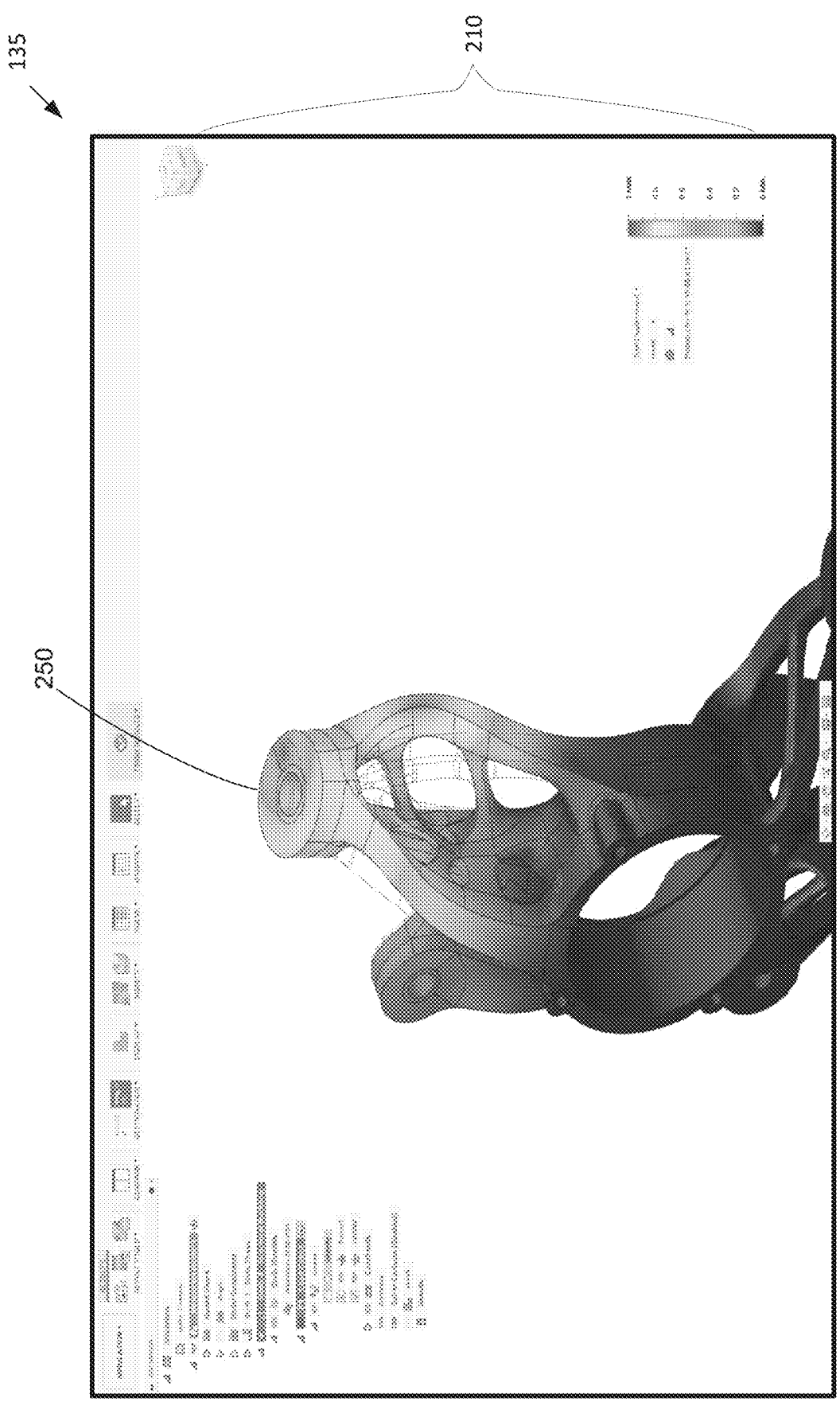
FIG. 10 is an exemplary screenshot of the client user interface (UI) of FIG. 1 in which a suggested simulation for a design is performed, according to various embodiments.

After the set of simulation parameters are determined, the simulation suggestion engine 112 may then automatically initiate the simulation engine 115 and initiate each suggested simulation tool of the simulation engine 115, and load the set of simulation parameters and corresponding values for the object type to each suggested simulation tool. Each suggested simulation tool may require a different subset of simulation parameters, whereby the simulation suggestion engine 112 automatically loads only the simulation parameters applicable to the particular suggested simulation tool. The one or more suggested simulation tools are then executed on the design via the simulation engine 115 using the set of simulation parameters. FIG. 10 is an exemplary screenshot of the client user interface (UI) of FIG. 1 in which a suggested simulation for a design is performed, according to various embodiments. In the example of FIG. 10, the suggested simulation tool comprises a buckling simulation that is applied to the object 250 in the design 210, the object 250 comprising a car suspension component. The simulation engine 115 is initiated to apply the suggested simulation tool to the object 250 using the set of simulation parameters and corresponding values determined for an object type comprising a car suspension component.

Techniques for Automatically Selecting and Performing Simulations

Figure 11:
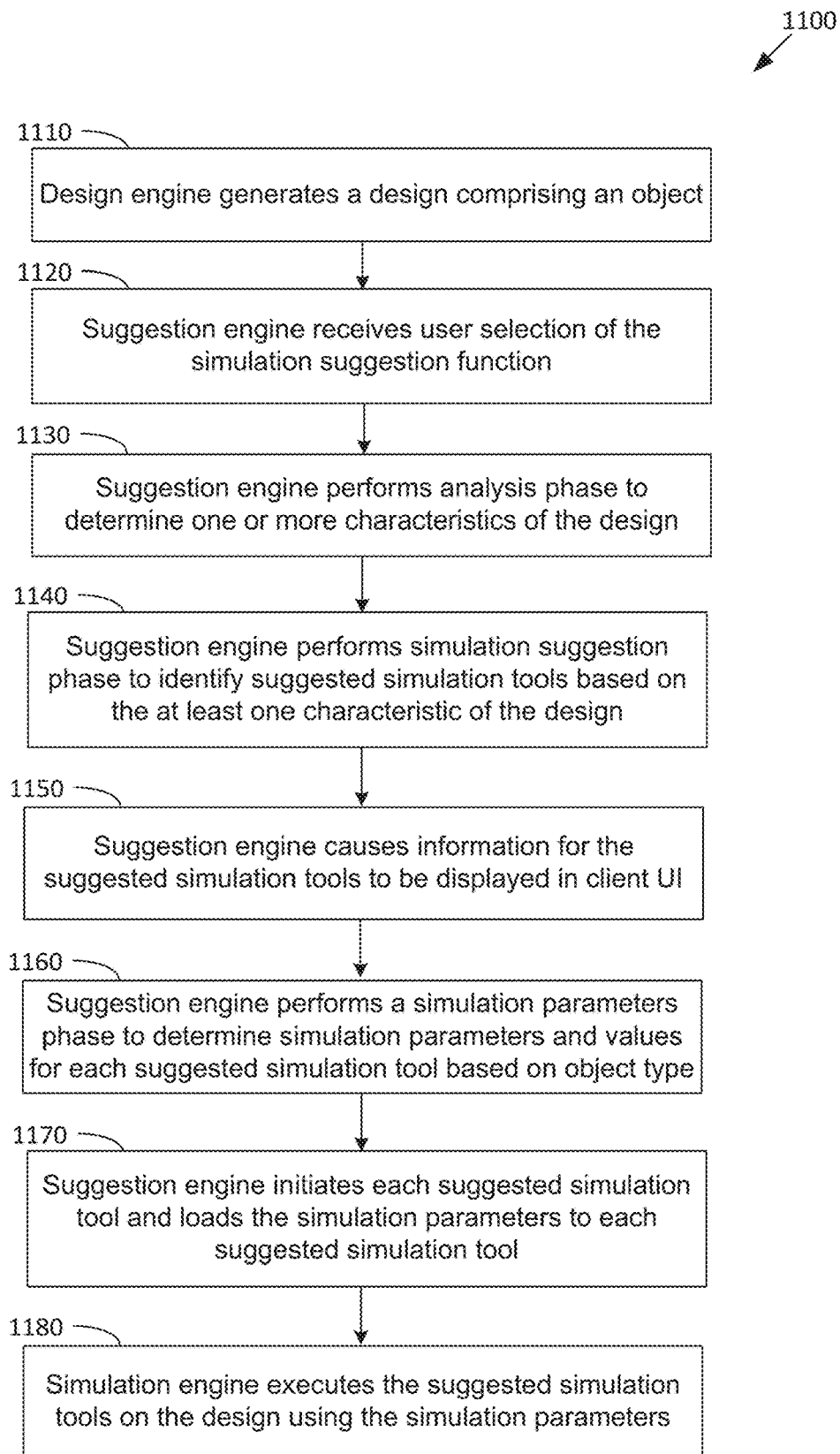
FIG. 11 is a flow diagram of method steps for automatically selecting one or more simulation tools for and performing one or more related simulations on a computer-generated design, according to various embodiments.

FIG. 11 is a flow diagram of method steps for automatically selecting one or more simulation tools for and performing one or more related simulations on a computer-generated design, according to various embodiments. Although the method steps are described in conjunction with the systems of FIGS. 1-10, persons skilled in the art will understand that the method steps can be performed in any order by any system. In some embodiments, the method 1100 may be performed by the design engine 111, simulation suggestion engine 112, and simulation engine 115 executing on a server 110 in conjunction with an interface engine 132 executing on a client 130 that displays a client UI 135.

The method 1100 begins when the design engine 111 generates (at step 1110) a design comprising an object (such as a 3D model of the object). The design is generated based on user inputs received by the design engine 111 via the client UI 135 displayed at the client 130. The completed design of the object is displayed in the client UI 135, which also displays a user-selectable "Simulation Suggestions" function/button 275. The simulation suggestion engine 112 receives (at step 1120) a user selection of the "Simulation Suggestion" function/button 275.

In response to the user selection of the "Simulation Suggestion" button 275, the simulation suggestion engine 112 automatically performs (at step 1130) an analysis phase on the completed design of the object to determine a set of one or more characteristics of the design. In the analysis phase, the simulation suggestion engine 112 executes a set of one or more analysis tools to determine the set of characteristics of the design. The set of analysis tools may include one or more different feature detection tools 113, each feature detection tool 113 being configured to detect one or more predetermined features (characteristics) of the design. For example, an aspect ratio tool may be implemented to detect thin/slender features in the design. The set of analysis tools may also include an object detection tool 114 configured to identify the type of object represented in the design, the object type comprising a characteristic of the design. For example, the object detection tool 114 may be implemented to identify the object as a car suspension component. The set of analysis tools may include at least one feature detection tool and/or the object detection tool.

The simulation suggestion engine 112 then automatically performs (at step 1140) a simulation suggestion phase to identify one or more suggested simulations/simulation tools based on the at least one characteristic determined in the analysis phase. In some embodiments, the simulation suggestion engine 112 may identify one or more suggested simulations/simulation tools for each characteristic determined in the analysis phase. For example, the simulation suggestion engine 112 may suggest/identify a structural buckling simulation and a linear static simulation based on detection of one or more thin features in the design. In additional, the simulation suggestion engine 112 may also suggest/identify a modal frequency simulation based on identification of the object as a car suspension component. The simulation suggestion engine 112 may do using one or more simulation mapping tables 116, including a feature mapping table 117 and/or an object mapping table 118. The feature mapping table 117 comprises a plurality of entries, each entry mapping a predetermined feature to one or more suggested simulations/simulation tools for the predetermined feature. The object mapping table 118 comprises a plurality of entries, each entry mapping a type of object to one or more suggested simulations/simulation tools for the type of object. The simulation suggestion engine 112 then causes (at step 1150) information ("simulation information") related to the one or more suggested simulations/simulation tools to be displayed at the client 130 via the client UI 135.

The simulation suggestion engine 112 then performs (at step 1160) a simulation parameters phase to automatically determine a set of simulation parameters and corresponding values for each suggested simulation/simulation tool based on the object type being designed. In this phase, the simulation suggestion engine 112 may implement the object detection tool to identify the type of object in the design. The simulation suggestion engine 112 may then map the identified object type to a set of simulation parameters by accessing a simulation parameter mapping table 119. The simulation parameter mapping table 119 comprises a plurality of entries, each entry comprising a mapping from a particular object type to a set of simulation parameters for the object type. For example, the simulation suggestion engine 112 may determine a set of simulation parameters and values appropriate for an object type comprising a car suspension component.

The simulation suggestion engine 112 then initiates (at step 1170) the simulation engine 115 and each suggested simulation tool of the simulation engine 115, and loads the set of simulation parameters and corresponding values to each suggested simulation tool. The simulation engine 115 then executes (at step 1180) the one or more suggested simulation tools on the design using the set of simulation parameters. The method 1100 then ends.

Server and Client Machines

Figure 12:
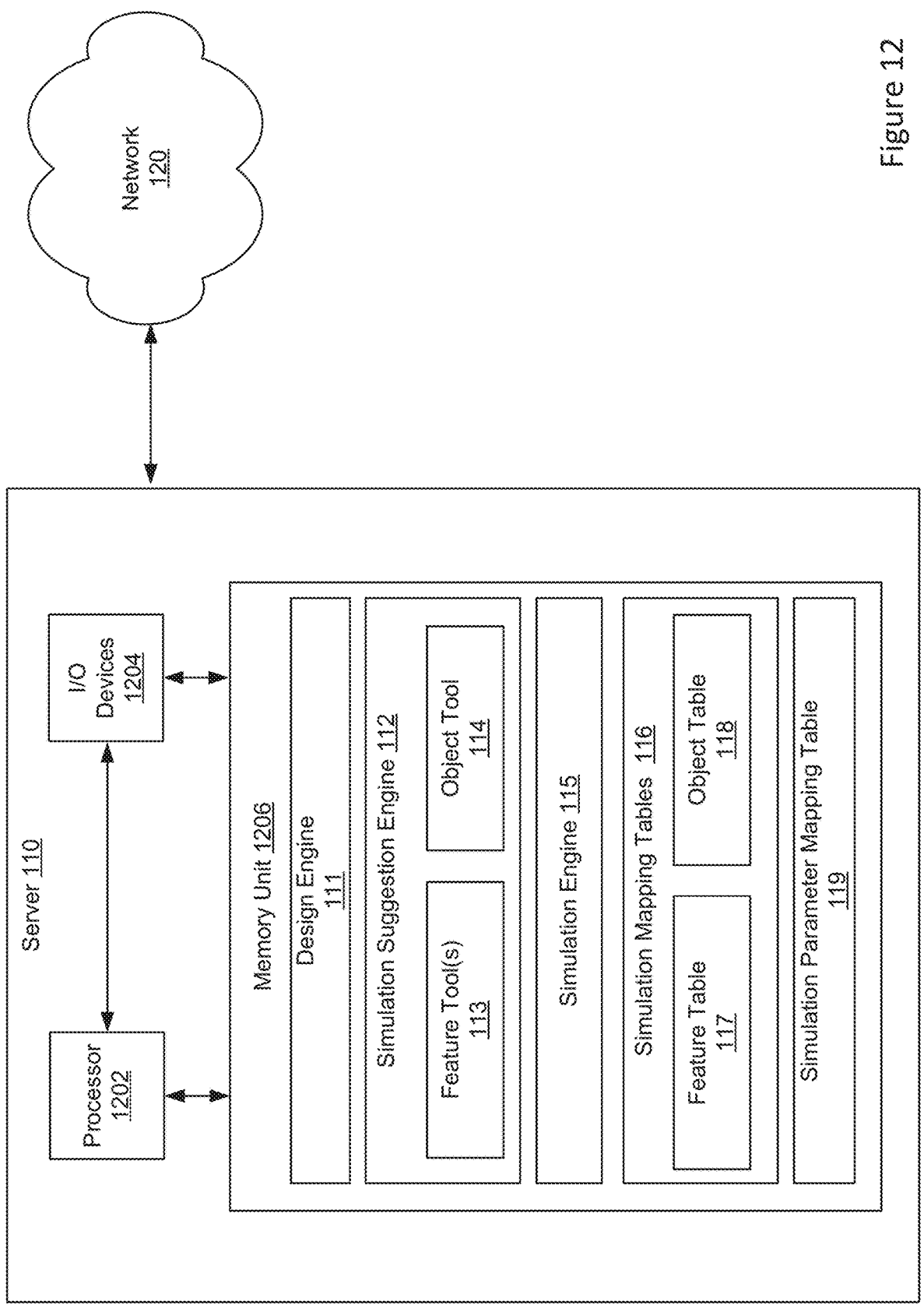
FIG. 12 illustrates an exemplary server device that can be implemented in the system of FIG. 1, according to various embodiments.

FIG. 12 illustrates an exemplary server device that can be implemented in the system of FIG. 1, according to various embodiments. The server 110 may comprise a computing device or machine, such as a server system, desktop computer, laptop computer, or any other type of computing device suitable for practicing various embodiments. The server 110 may comprise a virtual computing instance executing within a computing cloud.

The server 110 comprises at least one processor 1202, input/output (I/O) devices 1204, and a memory unit 1206, coupled together. The server 110 is coupled to a network 120 via a network interface (not shown). The network 120 may comprise any technically feasible communications or information network, wired or wireless, that allows data exchange, such as a wireless (W-Fi) network, personal area network (such as Bluetooth, Wireless USB, IrDA, etc.), wide area network (WAN), a local area network (LAN), and/or the Internet, among others.

In general, a processor 1202 may be any technically feasible processing device or hardware unit capable of processing data and executing software applications and program code. The processor 1202 executes the software and performs the functions and operations set forth in the embodiments described herein. For example, a processor 1202 may comprise a central processing unit (CPU), a graphics processing unit (GPU), a digital signal processor (DSP), an application-specific integrated circuit (ASIC), a field programmable gate array (FPGA) or other programmable logic device, discrete gate or transistor logic, discrete hardware components, or any combination of different processing units, such as a CPU configured to operate in conjunction with a GPU, or many CPUs configured to work together through cloud computing.

The memory unit 1206 may include a hard disk, a random access memory (RAM) module, a flash memory unit, or any other type of memory unit or combination thereof. Processor and I/O devices read data from and write data to memory 1206. The memory unit 1206 is configured to store software application(s) and data. Instructions from the software constructs within the memory unit 1206 are executed by processors to enable the operations and functions described herein. In various embodiments, the memory unit 1206 is configured to store a design engine 111, simulation suggestion engine 112, simulation engine 115, simulation mapping tables 116, and simulation parameter mapping table 119 for performing embodiments herein. The server 110 may be connected to a database 125 (not shown) that simulation data 127. The processor 1202 is configured to execute the design engine 111, simulation suggestion engine 112, and simulation engine 115 to provide an underlying functionality of a simulation suggestion system as described in various embodiments herein.

I/O devices 1204 are also coupled to memory 1206 and may include devices capable of receiving input, such as a keyboard, a mouse, a trackball, and so forth, as well as devices capable of providing output, such as a display, speaker, and so forth. Additionally, I/O devices may include devices capable of both receiving input and providing output, such as a touchscreen, a universal serial bus (USB) port, and so forth.

Figure 13:
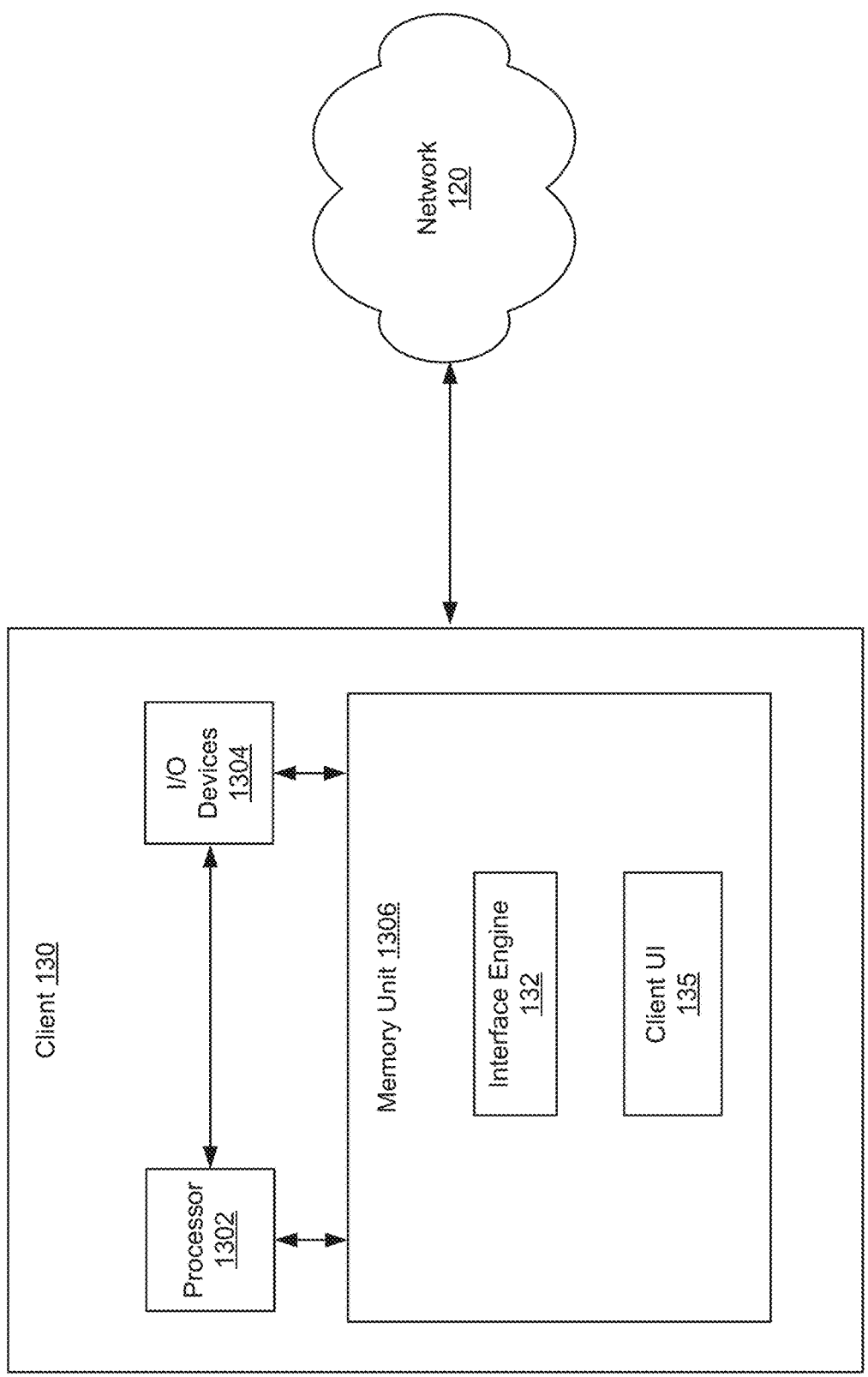
FIG. 13 illustrates an exemplary client device that can be implemented in the system of FIG. 1, according to various embodiments.

FIG. 13 illustrates an exemplary client device that can be implemented in the system of FIG. 1, according to various embodiments. The client 130 may comprise a computing device or machine, such as a desktop computer, laptop computer, mobile device, or any other type of computing device suitable for practicing various embodiments.

The client 130 comprises at least one processor 1302, input/output (I/O) devices 1304, and a memory unit 1306, coupled together. The client 130 is coupled to a network 120 via a network interface (not shown). In general, a processor 1302 may be any technically feasible processing device or hardware unit capable of processing data and executing software applications and program code. The processor 1302 executes the software and performs the functions and operations set forth in the embodiments described herein. For example, a processor 1302 may comprise a central processing unit (CPU), a graphics processing unit (GPU), a digital signal processor (DSP), an application-specific integrated circuit (ASIC), a field programmable gate array (FPGA) or other programmable logic device, discrete gate or transistor logic, discrete hardware components, or any combination of different processing units, such as a CPU configured to operate in conjunction with a GPU, or many CPUs configured to work together through cloud computing.

The memory unit 1306 may include a hard disk, a random access memory (RAM) module, a flash memory unit, or any other type of memory unit or combination thereof. Processor and I/O devices read data from and write data to memory 1306. The memory unit 1306 is configured to store software application(s) and data. Instructions from the software constructs within the memory unit 1306 are executed by processors to enable the operations and functions described herein. In various embodiments, the memory unit 1306 is configured to store an interface engine 132 for performing embodiments herein. The processor 1302 is configured to execute the interface engine 132 to provide an underlying functionality of a simulation suggestion system as described in various embodiments herein.

I/O devices 1304 are also coupled to memory 1306 and may include devices capable of receiving input, such as a keyboard, a mouse, a trackball, and so forth, as well as devices capable of providing output, such as a monitor/display, speaker, and so forth. Additionally, I/O devices may include devices capable of both receiving input and providing output, such as a touchscreen, a universal serial bus (USB) port, and so forth. In particular, the I/O devices may further include a display monitor that displays a client UI 135.

In sum, embodiments described herein are directed towards a computer system (such as a server system or client device) executes a design engine for generating designs, a simulation suggestion engine for identifying suggested simulations for the designs, and a simulation engine for performing the suggested simulations on the designs. The simulation engine may include one or more simulation tools for performing one or more suggested simulations on a design. A user may complete a design of an object via the design engine. The simulation suggestion engine may automatically identify one or more simulation tools that are appropriate for the completed design based on at least one characteristic of the design. The simulation suggestion engine may further automatically identify and load simulation parameters (boundary conditions) for the suggested simulations/simulation tools. The suggested simulations/simulation tools are then performed/executed on the completed design via the simulation engine.

At least one technical advantage of the disclosed techniques relative to the prior art is that the disclosed techniques enable a simulation suggestion engine to automatically analyze a computer-generated design and select one or more appropriate simulations for the design. In this regard, the simulation suggestion engine is configured to perform an analysis of the design, via one or more analysis tools, to determine at least one characteristic of the design, and then identify one or more suggested simulations for the design based on the at least one characteristic of the design. Simulation information related to the at least one suggested simulation tool is then displayed to the user. Thus, novice users may automatically receive information for simulations appropriate for their designs without having to rely on their own limited knowledge and experience. In this manner, the proper simulations for a design may be identified, selected, and performed to ensure that a design is sufficient for the intended purpose/function of the design. Another technical advantage relative to the prior art is that the simulation suggestion engine automatically determines and load simulation parameters (boundary conditions) for the one or more suggested simulations. Thus, novice users also do not have to rely on their own limited knowledge and experience in setting up a simulation. These technical advantages represent one or more technological advancements over prior art approaches.

Aspects of the subject matter described herein are set out in the following numbered clauses.

1. In some embodiments, a computer-implemented method for automatically selecting and executing one or more simulation tools for designs, the method comprising: executing, via a simulation suggestion engine, at least one analysis tool to determine at least one characteristic of a computer-generated design; selecting, via the simulation suggestion engine, at least one simulation tool based on the at least one characteristic; and causing simulation information related to the at least one simulation tool to be displayed at a client device via a graphical user interface.

2. The computer-implemented method of clause 1, wherein the simulation information comprises a name of the at least one simulation tool and a set of simulation parameters for the at least one simulation tool.

3. The computer-implemented method of any of clauses 1-2, wherein the at least one analysis tool comprises a feature detection tool configured to detect a predetermined feature in the computer-generated design.

4. The computer-implemented method of any of clauses 1-3, wherein selecting the at least one simulation tool comprises identifying the at least one simulation tool via a feature mapping table that maps the predetermined feature to the at least one simulation tool.

5. The computer-implemented method of any of clauses 1-4, wherein the at least one analysis tool comprises an object detection tool configured to identify an object type included in the computer-generated design.

6. The computer-implemented method of any of clauses 1-5, wherein the object detection tool implements machine learning functionality to identify the object type included in the computer-generated design.

7. The computer-implemented method of any of clauses 1-6, wherein selecting the at least one simulation tool comprises identifying the at least one simulation tool via an object mapping table that maps the object type to the at least one simulation tool.

8. The computer-implemented method of any of clauses 1-7, further comprising: identifying, via the simulation suggestion engine, a set of simulation parameters for the at least one simulation tool based on at least one object type included in the computer-generated design; and loading the set of simulation parameters into the at least one simulation tool.

9. The computer-implemented method of any of clauses 1-8, further comprising executing the at least one simulation tool.

10. The computer-implemented method of any of clauses 1-9, further comprising identifying the at least one object type included in the computer-generated design via an object detection tool that is trained using machine learning techniques to identify different types of designed objects.

11. In some embodiments, one or more non-transitory computer-readable media including instructions that, when executed by one or more processors, cause the one or more processors to perform the steps of: executing, via a simulation suggestion engine, at least one analysis tool to determine at least one characteristic of a computer-generated design; selecting, via the simulation suggestion engine, at least one simulation tool based on the at least one characteristic; and causing simulation information related to the at least one simulation tool to be displayed at a client device via a graphical user interface.

12. The one or more non-transitory computer-readable media of clause 11, wherein the simulation information comprises a name of the at least one simulation tool and a set of simulation parameters for the at least one simulation tool.

13. The one or more non-transitory computer-readable media of any of clauses 11-12, wherein the at least one analysis tool comprises an aspect ratio tool configured to detect thin features in the computer-generated design.

14. The one or more non-transitory computer-readable media of any of clauses 11-13, wherein selecting the at least one simulation tool comprises identifying the at least one simulation tool via a feature mapping table that maps detection of thin features to the at least one simulation tool.

15. The one or more non-transitory computer-readable media of any of clauses 11-14, wherein the at least one analysis tool comprises an object detection tool configured to identify an object type included in the computer-generated design.

16. The one or more non-transitory computer-readable media of any of clauses 11-15, wherein the object detection tool implements machine learning functionality to identify the object type included in the computer-generated design.

17. The one or more non-transitory computer-readable media of any of clauses 11-16, wherein selecting the at least one simulation tool comprises identifying the at least one simulation tool via an object mapping table comprising a plurality of entries, each entry comprising a mapping between a particular object type and at least one simulation tool.

18. The one or more non-transitory computer-readable media of any of clauses 11-17, further comprising: identifying, via the simulation suggestion engine, a set of simulation parameters for the at least one simulation tool based on at least one object type included in the computer-generated design; and loading the set of simulation parameters into the at least one simulation tool.

19. The one or more non-transitory computer-readable media of any of clauses 11-18, further comprising executing the at least one simulation tool.

20. In some embodiments, a computing system comprising: a memory that includes instructions; and a processor that is coupled to the memory and, upon executing the instructions, performs the steps of: executing at least one analysis tool to determine at least one characteristic of a computer-generated design; selecting at least one simulation tool based on the at least one characteristic; and causing simulation information related to the at least one simulation tool to be displayed at a client device via a graphical user interface.

Any and all combinations of any of the claim elements recited in any of the claims and/or any elements described in this application, in any fashion, fall within the contemplated scope of the present invention and protection.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

Aspects of the present embodiments may be embodied as a system, method or computer program product. Accordingly, aspects of the present disclosure may take the form of an entirely hardware embodiment, an entirely software embodiment (including firmware, resident software, microcode, etc.) or an embodiment combining software and hardware aspects that may all generally be referred to herein as a "module" or "system." In addition, any hardware and/or software technique, process, function, component, engine, module, or system described in the present disclosure may be implemented as a circuit or set of circuits. Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine. The instructions, when executed via the processor of the computer or other programmable data processing apparatus, enable the implementation of the functions/acts specified in the flowchart and/or block diagram block or blocks. Such processors may be, without limitation, general purpose processors, special-purpose processors, application-specific processors, or field-programmable gate arrays.

The flowchart and block diagrams in the figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function (s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the preceding is directed to embodiments of the present disclosure, other and further embodiments of the disclosure may be devised without departing from the basic scope thereof, and the scope thereof is determined by the claims that follow.

The invention claimed is:

1. A computer-implemented method for automatically selecting and executing one or more simulation tools for designs, the method comprising:
   executing, via a simulation suggestion engine, at least one analysis tool to determine at least one characteristic of a three-dimensional computer-generated model;
   selecting, via the simulation suggestion engine, at least one simulation tool using, when the at least one characteristic is a predetermined feature, a feature mapping table that maps the predetermined feature to the at least one simulation tool, or using, when the at least one characteristic is an object type, an object mapping table that maps the object type to the at least one simulation tool; and
   causing simulation information related to the at least one simulation tool to be displayed at a client device via a graphical user interface.

2. The computer-implemented method of claim 1, wherein the simulation information comprises a name of the at least one simulation tool and a set of simulation parameters for the at least one simulation tool.

3. The computer-implemented method of claim 1, wherein the at least one analysis tool comprises a feature detection tool configured to detect the predetermined feature in the computer-generated model.

4. The computer-implemented method of claim 1, wherein the at least one analysis tool comprises an object detection tool configured to identify the object type included in the computer-generated model.

5. The computer-implemented method of claim 4, wherein the object detection tool implements machine learning functionality to identify the object type included in the computer-generated model.

6. The computer-implemented method of claim 1, further comprising:
identifying, via the simulation suggestion engine, a set of simulation parameters for the at least one simulation tool based on the object type included in the computer-generated model; and
loading the set of simulation parameters into the at least one simulation tool.

7. The computer-implemented method of claim 6, further comprising executing the at least one simulation tool.

8. The computer-implemented method of claim 6, further comprising identifying the object type included in the computer-generated model via an object detection tool that is trained using machine learning techniques to identify different types of designed objects.

9. One or more non-transitory computer-readable media including instructions that, when executed by one or more processors, cause the one or more processors to perform the steps of:
executing, via a simulation suggestion engine, at least one analysis tool to determine at least one characteristic of a three-dimensional computer-generated model;
selecting, via the simulation suggestion engine, at least one simulation tool using, when the at least one characteristic is a predetermined feature, a feature mapping table that maps the predetermined feature to the at least one simulation tool, or using, when the at least one characteristic is an object type, an object mapping table that maps the object type to the at least one simulation tool; and
causing simulation information related to the at least one simulation tool to be displayed at a client device via a graphical user interface.

10. The one or more non-transitory computer-readable media of claim 9, wherein the simulation information comprises a name of the at least one simulation tool and a set of simulation parameters for the at least one simulation tool.

11. The one or more non-transitory computer-readable media of claim 9, wherein the at least one analysis tool comprises an aspect ratio tool configured to detect thin features in the computer-generated model.

12. The one or more non-transitory computer-readable media of claim 11, wherein selecting the at least one simulation tool comprises identifying the at least one simulation tool via the feature mapping table that further maps detection of thin features to the at least one simulation tool.

13. The one or more non-transitory computer-readable media of claim 9, wherein the at least one analysis tool comprises an object detection tool configured to identify the object type included in the computer-generated model.

14. The one or more non-transitory computer-readable media of claim 13, wherein the object detection tool implements machine learning functionality to identify the object type included in the computer-generated model.

15. The one or more non-transitory computer-readable media of claim 13, wherein selecting the at least one simulation tool comprises identifying the at least one simulation tool via the object mapping table comprising a plurality of entries, each entry comprising a mapping between a particular object type and at least one simulation tool.

16. The one or more non-transitory computer-readable media of claim 9, further comprising:
identifying, via the simulation suggestion engine, a set of simulation parameters for the at least one simulation tool based on at least one object type included in the computer-generated model; and
loading the set of simulation parameters into the at least one simulation tool.

17. The one or more non-transitory computer-readable media of claim 16, further comprising executing the at least one simulation tool.

18. A computing system comprising:
a memory that includes instructions; and
a processor that is coupled to the memory and, upon executing the instructions, performs the steps of:
executing at least one analysis tool to determine at least one characteristic of a three-dimensional computer-generated model;
selecting at least one simulation tool using, when the at least one characteristic is a predetermined feature, a feature mapping table that maps the predetermined feature to the at least one simulation tool, or using, when the at least one characteristic is an object type, an object mapping table that maps the object type to the at least one simulation tool; and
causing simulation information related to the at least one simulation tool to be displayed at a client device via a graphical user interface.

* * * * *